(12) United States Patent
Peterson et al.

(10) Patent No.: US 10,010,015 B2
(45) Date of Patent: Jun. 26, 2018

(54) COMPONENT CARRIER AND GUIDING SYSTEM FOR TUNABLE, ENHANCED CHASSIS AIRFLOW

(71) Applicant: Dell Products L.P., Round Rock, TX (US)

(72) Inventors: Chris Everett Peterson, Austin, TX (US); Bernard Strmiska, Round Rock, TX (US); Robert Boyd Curtis, Georgetown, TX (US); Richard Andrew Crisp, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 49 days.

(21) Appl. No.: 14/981,232

(22) Filed: Dec. 28, 2015

(65) Prior Publication Data

US 2017/0188485 A1 Jun. 29, 2017

(51) Int. Cl.
*H05K 7/20* (2006.01)

(52) U.S. Cl.
CPC ..... *H05K 7/20736* (2013.01); *H05K 7/20836* (2013.01)

(58) Field of Classification Search
CPC ....... H05K 7/20145; H05K 7/20554–7/20572; H05K 7/20163; H05K 7/20709–7/20727; H05K 7/20736; H05K 7/20618; G06F 1/20; G06F 1/203; G06F 1/1679; G06F 1/1658; G06F 1/187; G11B 33/142; G11B 33/124–33/125; G02F 2201/36
USPC .... 361/679.49–679.51, 695, 679.33, 679.37, 361/679.39, 679.46, 679.58, 690, 692; 454/184, 42, 261, 284; 312/236
See application file for complete search history.

(56) References Cited

U.S. PATENT DOCUMENTS

| | | | |
|---|---|---|---|
| 6,052,278 A * | 4/2000 | Tanzer | G11B 33/128 312/223.3 |
| 6,274,807 B1 * | 8/2001 | Pommerenke | H05K 9/0062 174/384 |

(Continued)

OTHER PUBLICATIONS

Mundt, et al., "Solid State Dirve Cooling in Defense Storage", U.S. Appl. No. 14/815,840, 19 pgs.

*Primary Examiner* — Dion R Ferguson
*Assistant Examiner* — Amir Jalali
(74) *Attorney, Agent, or Firm* — Haynes and Boone, LLP

(57) ABSTRACT

An enhanced airflow chassis system includes a component chassis that defines a chassis enclosure including a chassis entrance and component slots. First component carriers are mounted to first components and positioned in each of the component slots. Each first component carrier defines first component carrier airflow apertures that direct airflow entering the chassis entrance to the first component mounted to that first component carrier. A backplane located in the chassis enclosure opposite the component slots from the chassis entrance defines backplane airflow apertures and includes a component connector located adjacent each of the component slots that is connected to the first component mounted to the component carrier positioned in that component slot. A chassis venting member positioned between at least two of the component slots defines chassis venting member airflow apertures that direct airflow entering the chassis entrance through the chassis enclosure to a subset of the backplane airflow apertures.

20 Claims, 16 Drawing Sheets

(56) References Cited

U.S. PATENT DOCUMENTS

| | | | | |
|---|---|---|---|---|
| 6,288,902 B1* | 9/2001 | Kim | ............ | G11B 33/08 |
| | | | | 206/701 |
| 6,317,334 B1* | 11/2001 | Abruzzini | ............ | G11B 33/126 |
| | | | | 361/679.33 |
| 6,728,099 B1* | 4/2004 | Tsang | ............ | H05K 7/20727 |
| | | | | 361/678 |
| 7,139,170 B2* | 11/2006 | Chikusa | ............ | G06F 1/20 |
| | | | | 165/122 |
| 7,233,877 B2* | 6/2007 | King | ............ | H04L 43/0817 |
| | | | | 702/177 |
| 7,365,974 B2* | 4/2008 | Hartung | ............ | H05K 7/20563 |
| | | | | 165/104.33 |
| 7,593,225 B2* | 9/2009 | Sasagawa | ............ | G06F 1/187 |
| | | | | 165/104.33 |
| 7,988,063 B1* | 8/2011 | Dufresne, II | ............ | G06F 1/20 |
| | | | | 236/49.3 |
| 9,141,153 B2 | 9/2015 | Mundt et al. | | |
| 9,317,078 B2* | 4/2016 | Lam | ............ | G06F 1/187 |
| 9,317,081 B2 | 4/2016 | Mundt et al. | | |
| 9,332,677 B2* | 5/2016 | Nishio | ............ | H05K 7/20736 |
| 2007/0127202 A1* | 6/2007 | Scicluna | ............ | G06F 1/184 |
| | | | | 361/679.37 |
| 2009/0016019 A1* | 1/2009 | Bandholz | ............ | H05K 7/20736 |
| | | | | 361/695 |
| 2015/0181768 A1* | 6/2015 | Chen | ............ | H05K 7/20718 |
| | | | | 361/679.46 |
| 2015/0348593 A1 | 12/2015 | Mundt et al. | | |
| 2016/0033972 A1 | 2/2016 | Shabbir et al. | | |
| 2016/0048180 A1 | 2/2016 | Woo et al. | | |
| 2016/0202739 A1 | 7/2016 | Mundt et al. | | |

\* cited by examiner

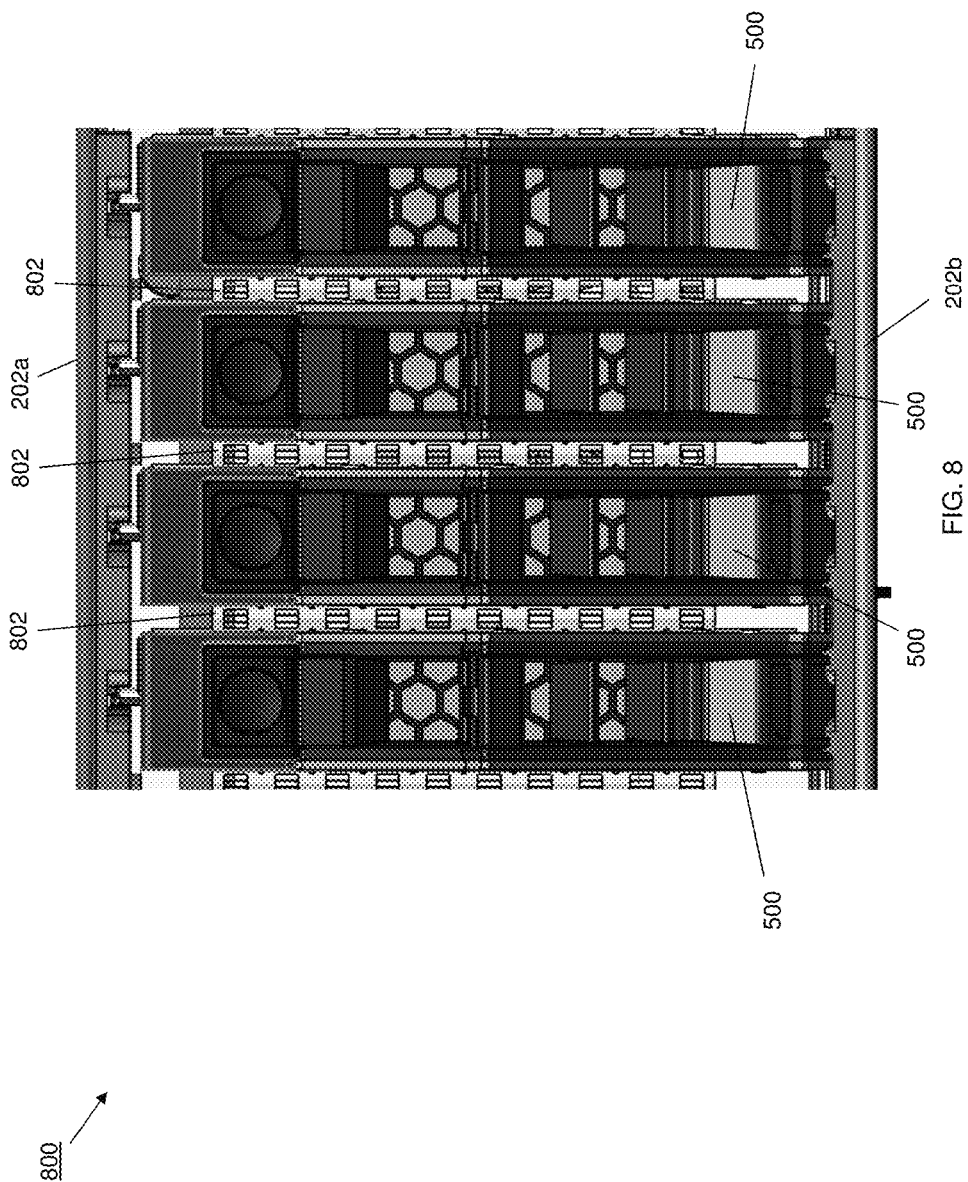

COMPONENT CARRIER AND GUIDING SYSTEM FOR TUNABLE, ENHANCED CHASSIS AIRFLOW

BACKGROUND

The present disclosure relates generally to information handling systems, and more particularly to a component carrier and guiding system to enhanced airflow in a chassis of an information handling system As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Some information handling systems such as, for example, servers and storage systems, sometimes include a chassis that houses the components of the system. For example, some servers include a chassis that defines a component enclosure for coupling a plurality of storage drives (e.g., hot-plug hard drives) adjacent a front entrance of the chassis, and that houses the other server components of the server opposite the storage drives from the front entrance of the chassis. Such servers typically draw air for cooling their server components through the front entrance of the chassis, and as the number of storage drives utilized in such servers grows, the coupling of those storage drives adjacent the front entrance of the chassis impedes airflow to the server components that are positioned behind those storage drives in the chassis. This hardware infrastructure airflow bottleneck becomes more prominent as the heat loads of the server components in the chassis increase due to new, higher power components in new generations of servers that utilize the chassis, the addition of components to the chassis, etc. Furthermore, an increase of fan speeds to overcome the airflow bottleneck at the front entrance of the chassis and provide sufficient cooling to the server components in the chassis results in undesirable side effects such as increased fan power consumption, vibration interference with other server components, and higher acoustic output/noise from the server Accordingly, it would be desirable to provide an improved chassis with enhanced airflow.

SUMMARY

According to one embodiment, an Information Handling System (IHS) includes a server chassis defining a storage enclosure that includes an entrance and a plurality of storage drive slots; a respective storage drive carrier mounted to a storage drive and positioned in each of the plurality of storage device slots, wherein each respective storage drive carrier defines a plurality of storage drive carrier apertures that are configured to direct airflow entering the server chassis through the entrance to the respective storage drive mounted to that storage drive carrier; a backplane that is located in the storage enclosure opposite the plurality of storage drive slots from the entrance of the server chassis, wherein the backplane defines a plurality of backplane airflow apertures and includes a respective storage drive connector located adjacent each of the plurality of storage device slots that is connected to the respective storage drive mounted to the storage drive carrier positioned in that storage drive slot; a processing system coupled to the backplane; and a server chassis venting member that is positioned between at least two of the plurality of storage drive slots, wherein the server chassis venting member defines a plurality of server chassis venting member airflow apertures that are configured to direct airflow that enters the server chassis through the entrance through the storage enclosure and a subset of the plurality of backplane airflow apertures to the processing system.

BRIEF DESCRIPTION OF THE DRAWINGS

FIG. 8 is a front view illustrating an embodiment of a plurality of components/component carriers of FIGS. 5A-5C coupled to the component chassis of FIGS. 2A and 2B using the backplane of FIG. 2D.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
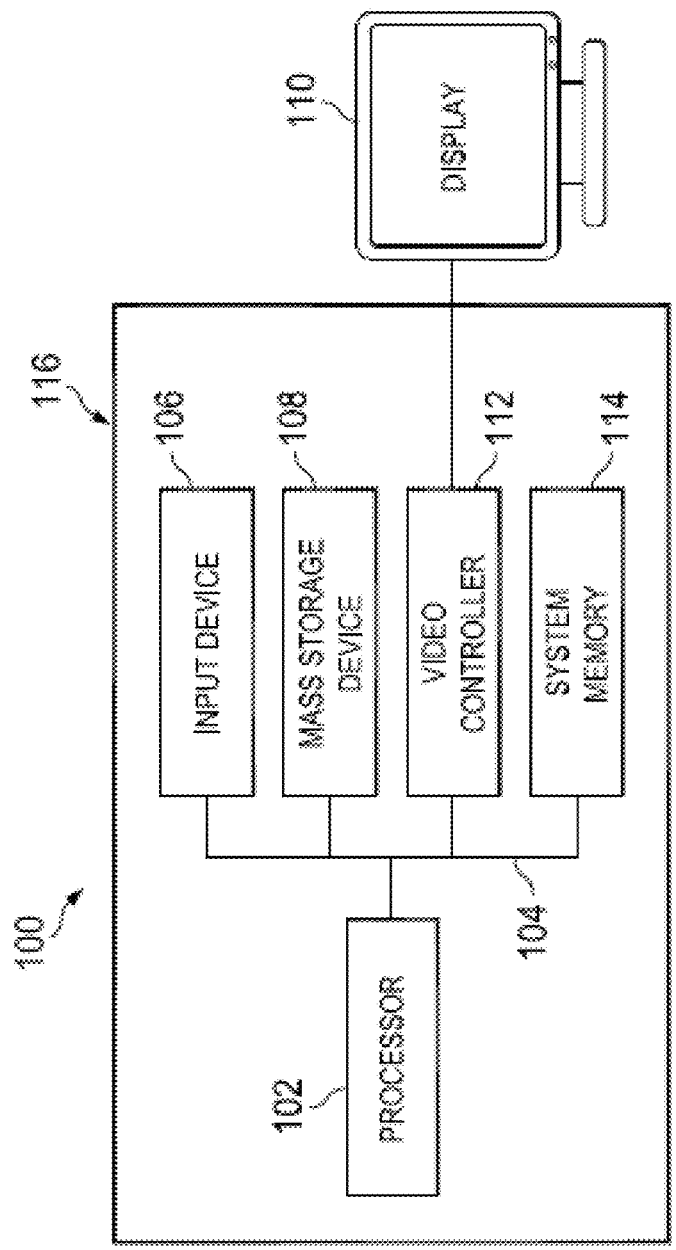
FIG. 1 is a schematic view illustrating an embodiment of an information handling system.

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2A:
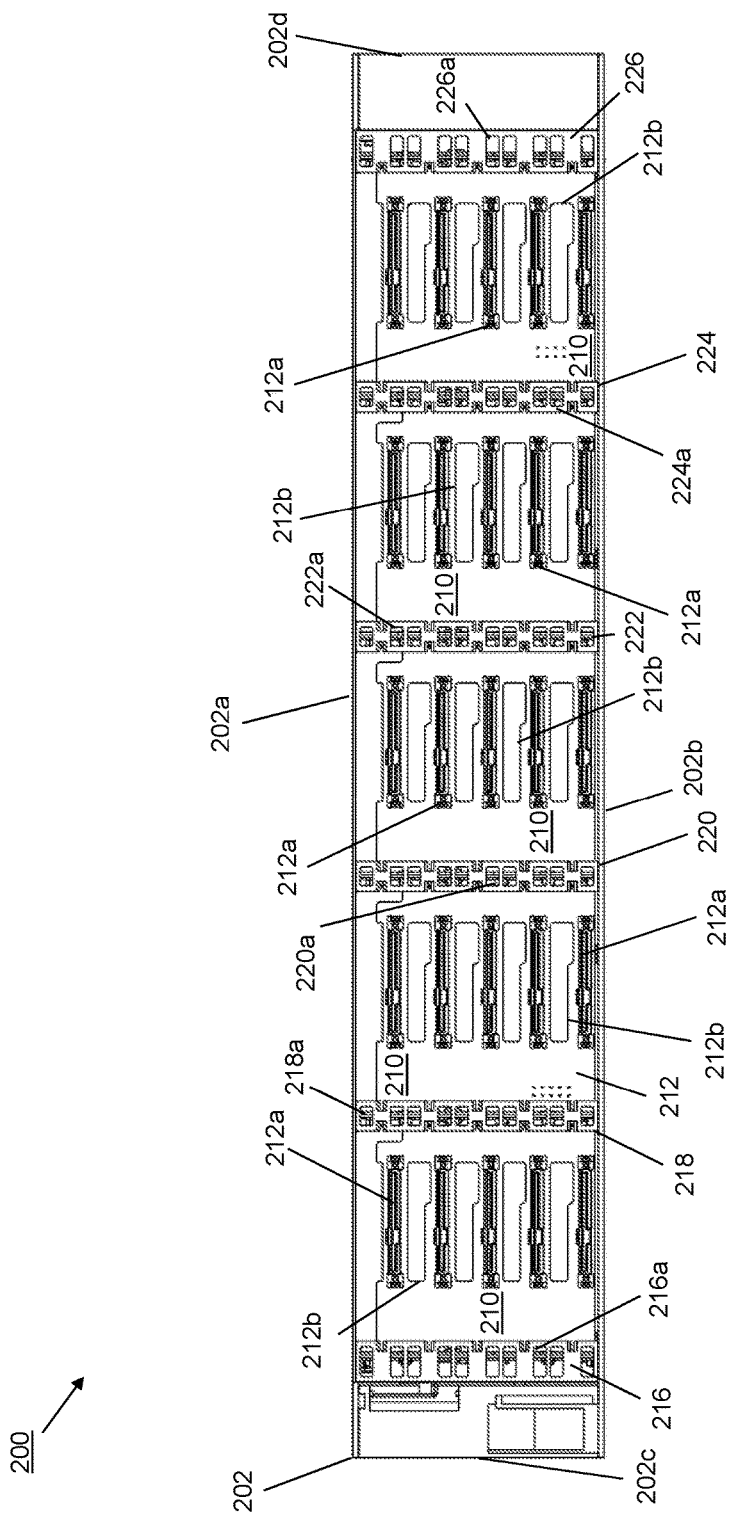
FIG. 2A is a front view illustrating an embodiment of a component chassis.
Figure 2B:
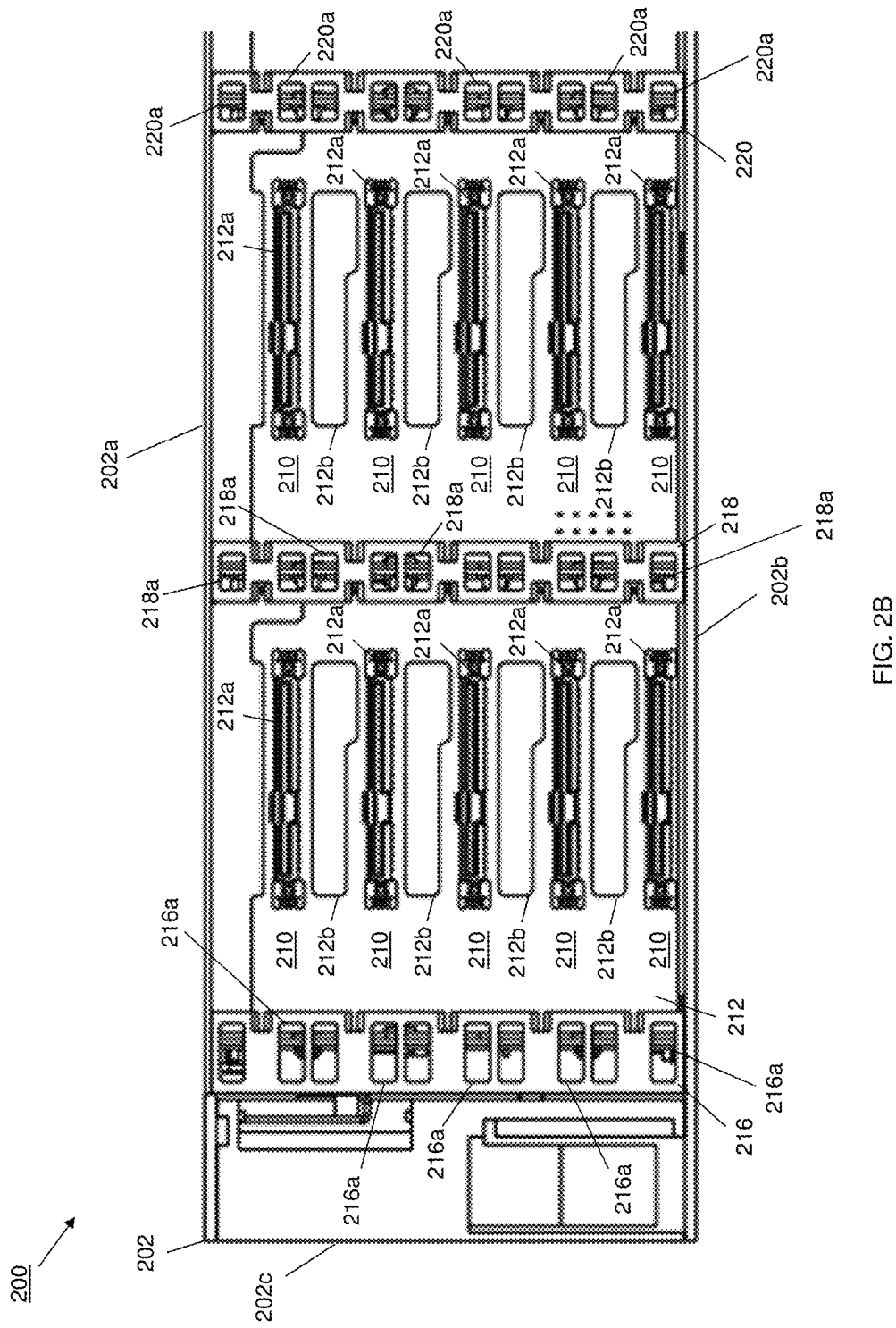
FIG. 2B is a front view illustrating an embodiment of the component chassis of FIG. 2A.
Figure 2C:
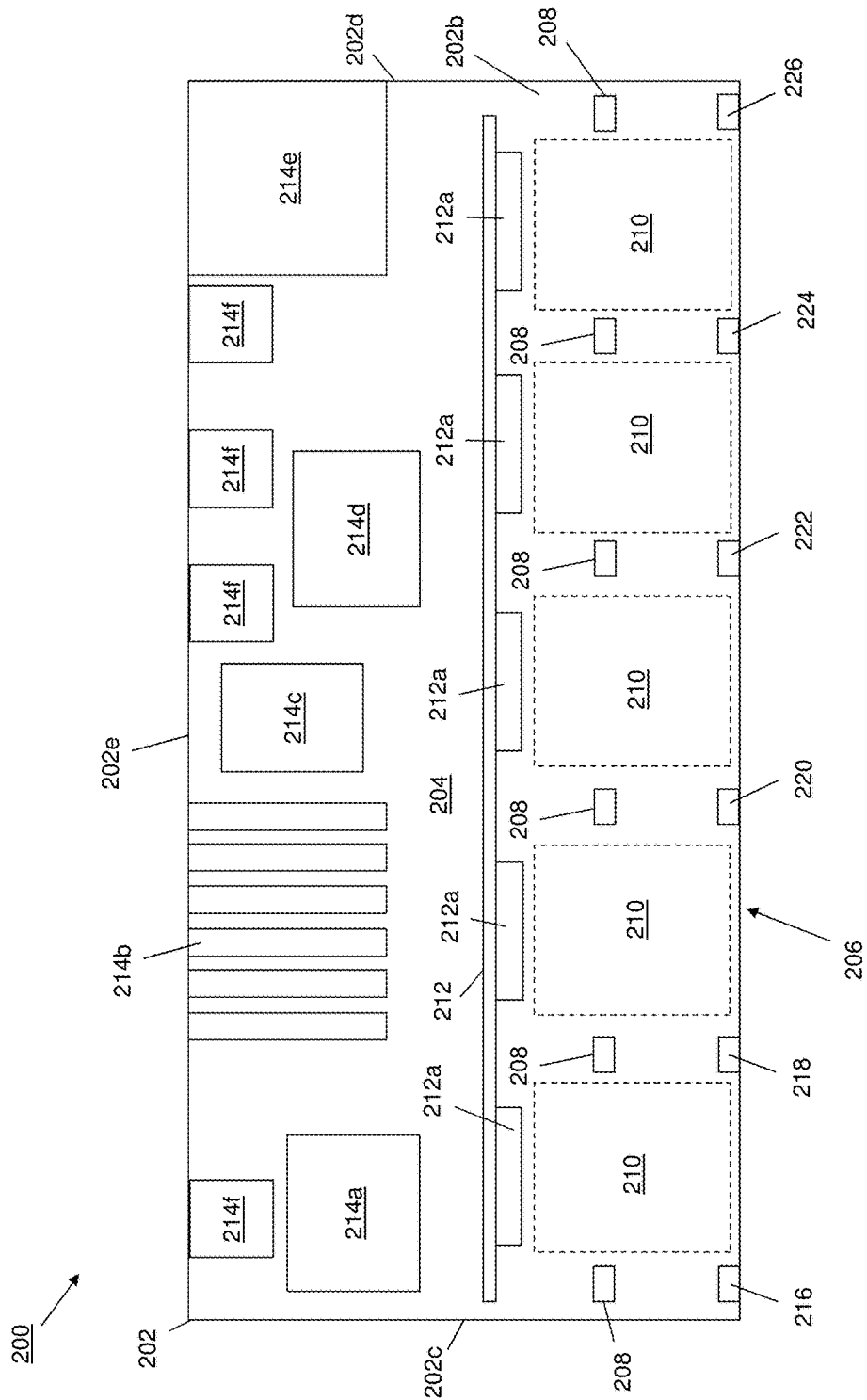
FIG. 2C is a schematic view illustrating an embodiment of the component chassis of FIGS. 2A and 2B

Referring now to FIGS. 2A, 2B, and 2C, an embodiment of a component chassis 200 is illustrated that may be the chassis 116 discussed above with reference to FIG. 1 and, as such, may house some or all of the components of the IHS 100. In the discussions below, the component chassis 200 is a server chassis that houses the components of a server including a plurality of storage drives for that server at a front entrance of the component chassis 200. However, other component chassis configurations will benefit from the teachings of the present disclosure and thus are envisioned as falling within its scope. The component chassis 200 includes a base 202 having a top wall 202a, a bottom wall 202b located opposite the component chassis 200 from the top wall 202a, a plurality of side walls 202c and 202d located opposite the component chassis 200 from each other and extending between the top wall 202a and the bottom wall 202b, and a rear wall 202e extending between the top wall 202a, the bottom wall 202b, and the side walls 202c and 202d. A chassis enclosure 204 is defined between the top wall 202a, the bottom wall 202b, and the side walls 202c and 202d, and includes a chassis entrance 206 that is defined by edges of the top wall 202a, the bottom wall 202b, and the side walls 202c and 202d that are opposite the rear wall 202e. In the illustrated embodiment, a plurality of guide members 208 are positioned in the chassis enclosure 204 to define a plurality of component slots 210 (illustrated with dashed lines in FIG. 2C). In the illustrated embodiment, the component chassis 200 provides five columns that each include five component slots, but other numbers and configurations of component slots are envisioned as falling within the scope of the present disclosure. Furthermore, the guide members 208 may include a variety of coupling and guiding features for coupling and guiding component carriers and components into the component slots 210, and may be replaced or supplemented with a variety of coupling and guiding features known in the art while remaining within the scope of the present disclosure.

A backplane 212 is located in the chassis enclosure 204 adjacent the plurality of component slots 210 and opposite the plurality of component slots 210 from the chassis entrance 206. A respective component connector 212a extends from the backplane 212 adjacent each of the plurality of component slots 210. A plurality of backplane airflow apertures 212b are defined in the backplane 212 and, in the illustrated embodiment, located adjacent the component connectors 212a, but other configurations of the backplane airflow apertures 212b are envisioned as falling within the scope of the present disclosure. A plurality of components 214a, 214b, 214c, 214d, 214e, and 214f are located in the chassis enclosure 204 opposite the backplane 212 from the plurality of component slots 210, and may include a processing system 214a, a memory system 214b, a controller 214c, a card 214d, a power system 214e, a fan system 214f, and/or any of a variety of other computing components known in the art. Furthermore, any or all of the components 214a-f may be coupled to the backplane 212 and/or each other via circuit boards, wired subsystems, wireless subsystems, and/or other coupling subsystems known in the art.

Chassis venting members 216, 218, 220, 222, 224, and 226 are located adjacent each of the plurality of component slots 210. In the illustrated embodiment, the chassis venting members 216 and 226 are located adjacent groups (e.g., a respective columns of five component slots 210) of the plurality of component slots 210 (e.g., on opposite sides of the plurality of component slots 210), and the chassis venting members 218, 220, 222, and 224 are located between groups (e.g., pairs of columns of five component slots 210) of the plurality of component slots 210. While each of the chassis venting members 216-226 are illustrated as located immediately adjacent the chassis entrance 206, in other embodiments the chassis venting members 216-226 may be positioned at different locations between the chassis entrance 206 and the backplane 212 while remaining within the scope of the present disclosure. Any or all of the chassis venting elements 216-226 may include coupling and guiding features for assisting the guide members 208 in coupling and guiding component carriers and components into the component slots 210. Each of the chassis venting elements 216-226 may define one or more respective chassis venting member airflow apertures 216a, 218a, 220a, 222a, 224a, and 226a.

In some embodiments, the chassis venting member airflow apertures 216a-226a on the chassis venting members 216-226 may be statically "tuned" or otherwise configured for a particular system based on the cooling needs of that system. For example, a system may include a variety of cooling criteria for both components positioned in the component slots 210 as well as the components 214a-214e located opposite the backplane 212 from the component slots 210, and the chassis venting member airflow apertures 216a-226a on the chassis venting members 216-226 may be statically sized, dimensioned, directed, and/or otherwise configured in order to direct air to components to provide a required level of cooling to those components while not providing more airflow than is needed to cool those components. As such, the chassis venting member airflow apertures 216a-226a on the chassis venting members 216-226 may be configured to direct a portion of the airflow that enters the chassis entrance 206 to the components located in the component slots 210 to provide sufficient cooling for those components, and also direct the remaining portion of the airflow towards the backplane airflow apertures 212b defined by the backplane 212. In a specific example, the chassis venting member airflow apertures 216a-226a on the chassis venting members 216-226 may be configured to direct airflow that enters the chassis entrance 206 to particular backplane airflow apertures 212b defined by the backplane 212 that provide airflow to components (e.g., the processing system 214a) that are known to generate more heat than other components (e.g., the card 214d) that are located opposite the backplane 212 from the plurality of component slots 210. While a specific example has been described, one of skill in the art in possession of the present disclosure will recognize that a variety of tuning or other configuration of the chassis venting members 216-226 according to the teachings of the present disclosure will fall within its scope.

In other embodiments, the chassis venting members 216-226 may include elements (e.g., shutters, airflow directionality elements, etc.) that provide for dynamic adjustment of the chassis venting member airflow apertures 216a-226a to change the size, dimensions, directionality, and/or configuration of the chassis venting member airflow apertures 216a-226a to allow for the dynamic adjustment of airflow received through the chassis enclosure 204 from the chassis entrance 206. For example, the controller 214c may be coupled to each of the chassis venting members 216-226 as well as any of the components in the component slots 210 (e.g., via the backplane 212 and component connectors 212a) and/or the components 214a-214f in order to determine cooling needs and dynamically adjust the configuration of the chassis venting member airflow apertures 216a-226a to direct airflow received through the chassis enclosure 204 to different components as the cooling needs of the system change. While a specific embodiment of the dynamic adjustment of airflow via the chassis venting members 216-226 has been described, one of skill in the art in possession of the present disclosure will recognize that other dynamic adjustment devices and methods may be provided in the chassis 200 while remaining within the scope of the present disclosure.

Figure 2D:
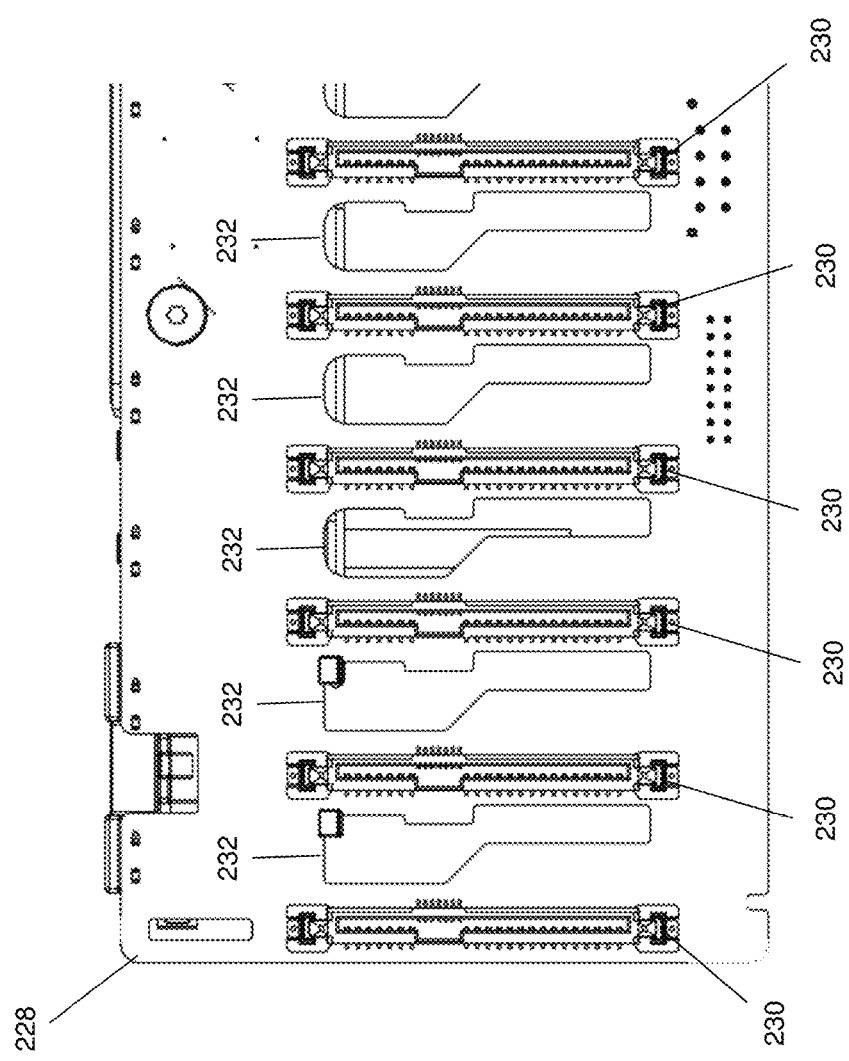
FIG. 2D is a front view illustrating an embodiment of a backplane that may be used in the component chassis of FIGS. 2A and 2B.

Referring now to FIG. 2D, an alternative embodiment of a backplane 228 is illustrated that provides a plurality of component connectors 230 and backplane airflow apertures 232 that are similar to the component connectors 212a and the backplane airflow apertures 212b discussed above, but provided in a different orientation. One of skill in the art will recognize that the component connectors 212a provide for the "horizontal" orientation of the component slots 210 in FIGS. 2A, 2B, and 2C (e.g., the five columns of horizontally oriented component slots 210 illustrated and discussed above), while the backplane 228 and component connectors 230 may be provided in the chassis 200 (with some modifications) to provide for a "vertical" orientation of the component slots 210 (e.g., the single row of vertically oriented component slots along the length of the component chassis 200 discussed in further detail below.) One of skill in the art in possession of the present disclosure will recognize that modifications to the chassis 200 and chassis components may be provided when the backplane 228 is included in the chassis 200 in order to provide the functionality discussed below while remaining within the scope of the present disclosure.

Figure 3A:
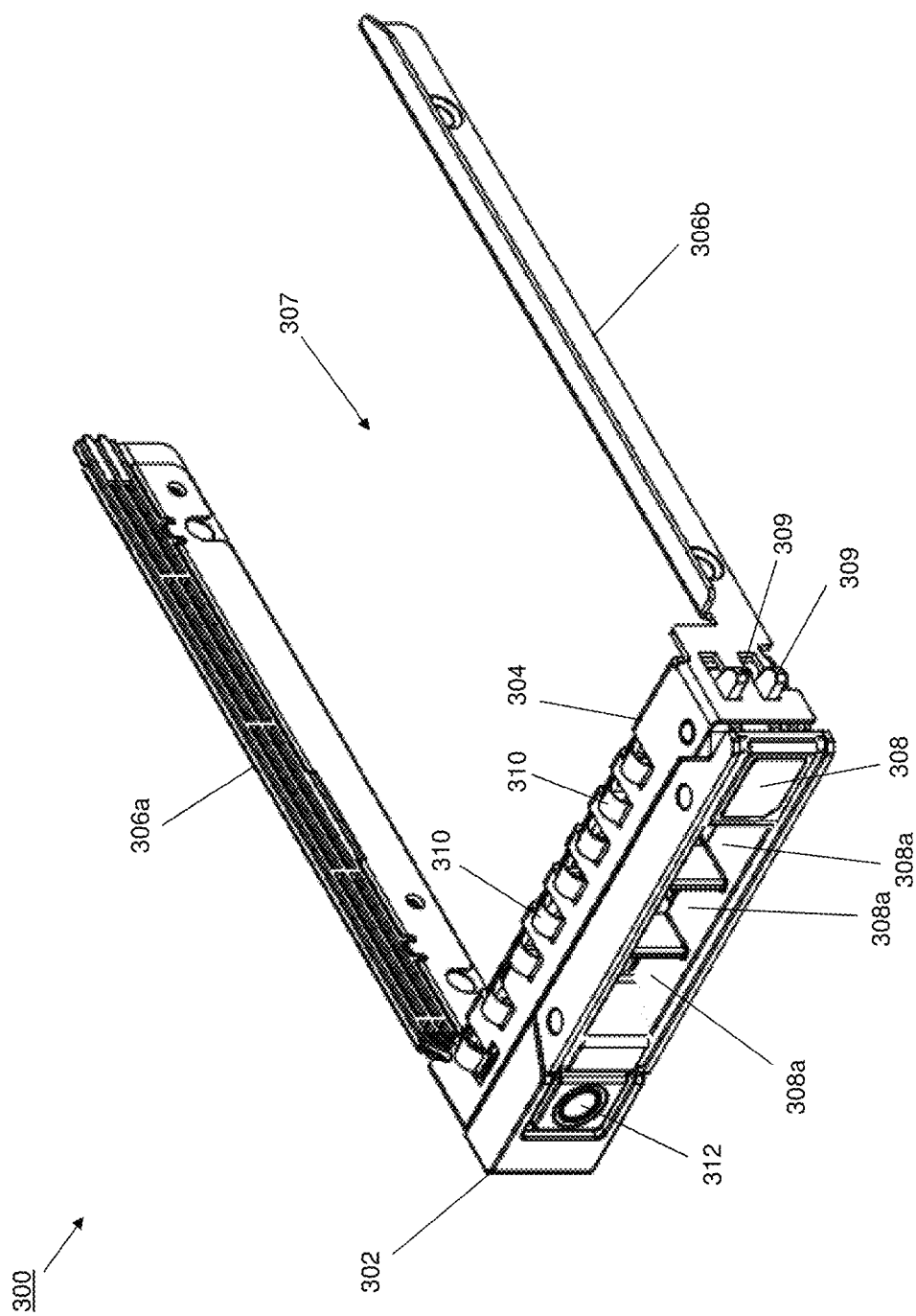
FIG. 3A is a perspective view illustrating an embodiment of a component carrier.
Figure 3B:
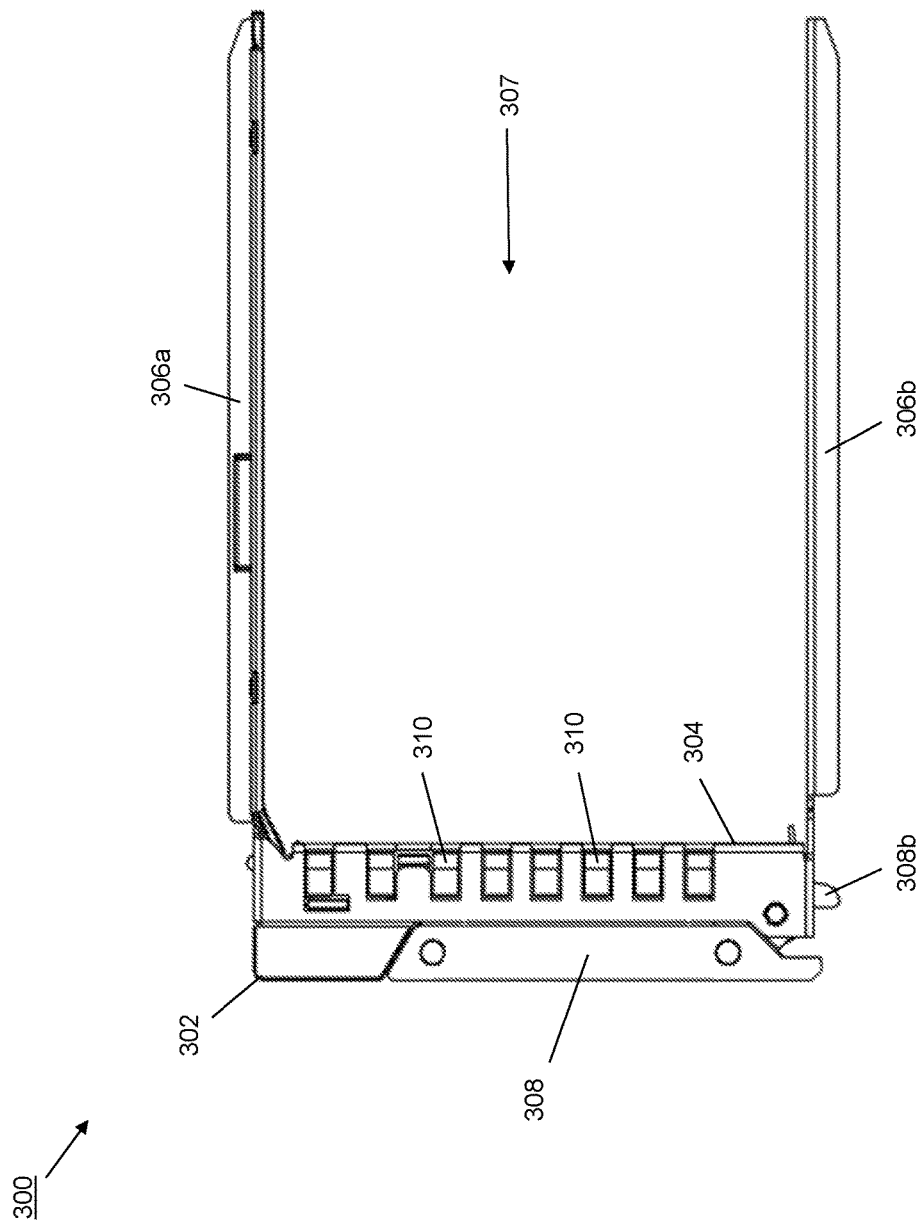
FIG. 3B is a top view illustrating an embodiment of the component carrier of FIG. 3A.

Referring now to FIGS. 3A and 3B, an embodiment of a component carrier 300 is illustrated. In the embodiments discussed below, the component carrier 300 is a storage device carrier that is configured to mount to a storage drive such as, for example, a hard disk drive, a solid state drive, and/or other storage drives known in the art. However, a variety of other components will benefit from the teachings of the present disclosure and thus are envisioned as falling within its scope. The component carrier 300 includes a carrier base 302 having a carrier front wall 304 and a plurality of carrier side walls 306a and 306b that extend in a substantially parallel orientation to each other from opposite edges of the carrier front wall 304 to define a component channel 307 between them. As discussed below, while not specifically called out with element numbers, each of the carrier side walls 306a and 306b may include a variety of coupling and guide features that are configured to couple component carrier to a component, and engage the component chassis 200 to guide the component carrier 300 into a component slot 210. The carrier front wall 304 includes a carrier securing handle 308 that defines, along with the carrier front wall 304, a plurality of component carrier airflow apertures 308a that extend through the carrier securing handle 308 and the carrier front wall 304 to the component channel 307. A plurality of component chassis engagement features 309 and 310 extend from the carrier front wall 304 and are configured to engage the component chassis 200 when the component carrier 300 is positioned in a component slot 210 to couple the component carrier 300 to the component chassis 200 and provide the benefits discussed below. A latch 312 is provided on the carrier front wall 304 and configured to secure and release the carrier securing handle 308 to allow the component carrier 300 to be secured to the component chassis 200.

As discussed below, the component carrier 300 is configured with a minimalistic guiding scheme (e.g., via the carrier side walls 306a and 306b) that reduces the cross-section of the component carrier 300 (i.e., when looking directly at the carrier front wall 304 opposite the component channel 307) relative to conventional component carriers while retaining a component, which allows for more airflow past the sides of the component carrier 300 (e.g., immediately adjacent the carrier side walls 306a and 306b) when the component carrier 300 is positioned in a component slot 210. Furthermore, the component carrier airflow apertures 308a may be sized, dimensioned, and/or otherwise configured to provide just enough airflow into the component channel 307 (and to a component) when the component carrier 300 is positioned in a component slot 210 (e.g., based on known airflow amounts generated through the component chassis 200 using the fan systems 214f in the component chassis 200) that will allow for the component to be sufficiently cooled for proper operation, which allows any remaining available airflow to be directed past the sides of the component carrier 300 (e.g., immediately adjacent the carrier side walls 306a and 306b) and to the other components in the component chassis 200. Finally, the mounting features that provide for the mounting of a component to the component carrier 300 are configured to minimize the air gap between the carrier front wall 304 and a component mounted to the component carrier 300 in the component channel 307 in order to minimize the space taken up in the component chassis 200 by the component carrier 300 while also minimizing airflow impedance between the carrier front wall 304 and the component mounted to the component carrier 300, discussed in further detail below. As such, the component carrier 300 may be designed, dimensioned, and/or otherwise configured to provide the enhanced airflow discussed below based on specific needs of the system components and the system provided by the component chassis 200.

Figure 4:
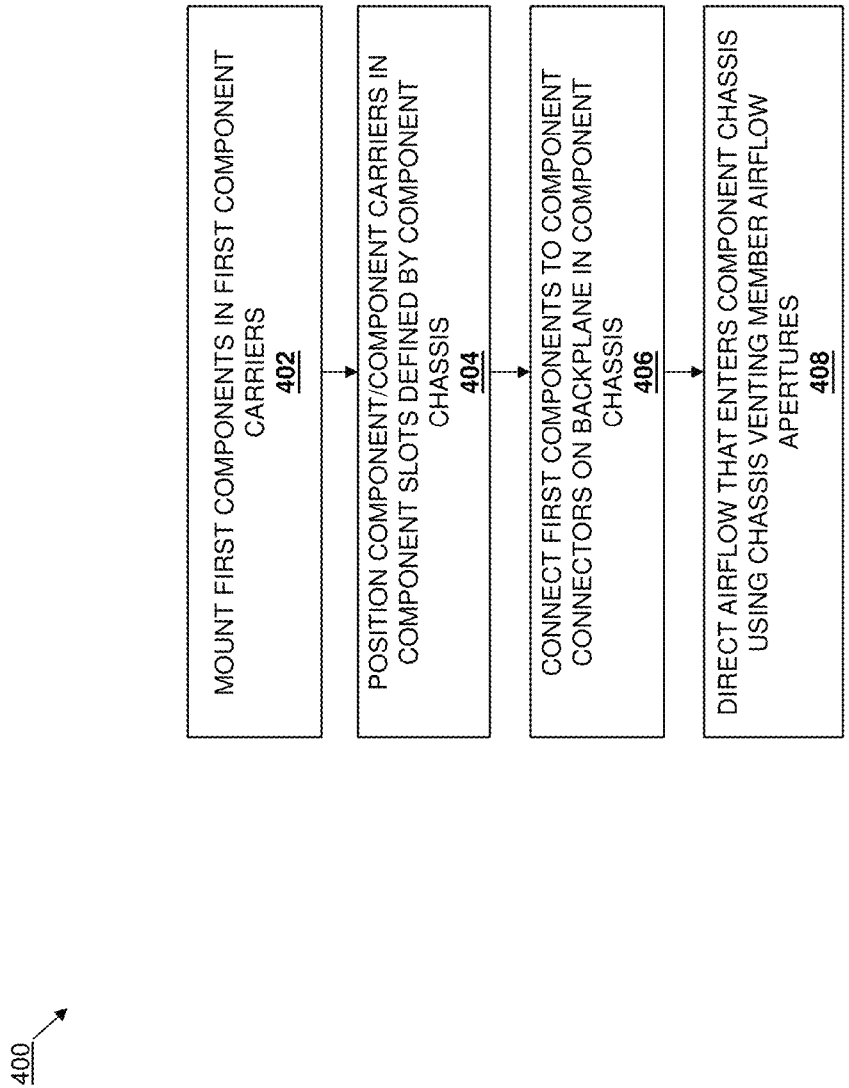
FIG. 4 is a flow chart of a method for providing airflow in a component chassis.

Referring now to FIG. 4, an embodiment of a method 400 for providing airflow through a chassis is illustrated. As discussed below, the systems and methods of the present disclosure provide a component chassis and component carriers that may be "tuned" for the components that need cooling in the system so that airflow is balanced throughout the component chassis to the components that need it. In specific embodiments, this is accomplished with interlocking component carriers having a minimalist component carrier guiding scheme that provides the smallest cross-section that can retain a component in the component chassis in order to allow increased airflow past the sides of the component carrier, while also providing chassis venting members on the sides of the component carrier to direct that airflow through a backplane in the component chassis to components behind that backplane that need cooling. Combined with tuned apertures in the component carrier that ensure sufficient airflow to the component mounted therein, airflow throughout the component chassis may be balanced and directed according to a system or device design point cooling criteria, allowing denser systems that may operate without the need to increase the size or operation of the fan systems that would result in increased noise, vibration, and other issues discussed above.

Figure 5A:
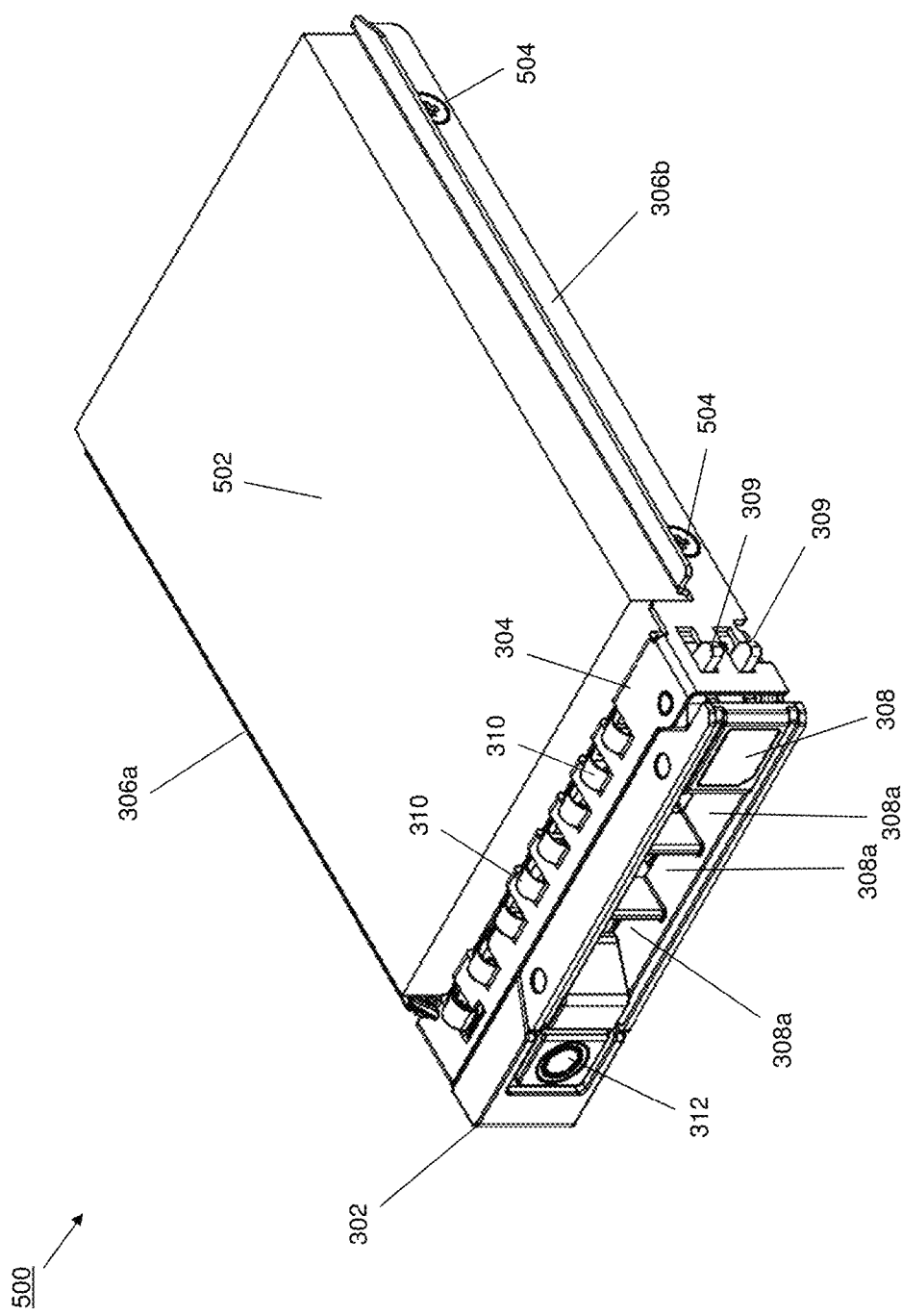
FIG. 5A is a perspective view illustrating an embodiment of a component mounted to the component carrier of FIGS. 3A and 3B.
Figure 5B:
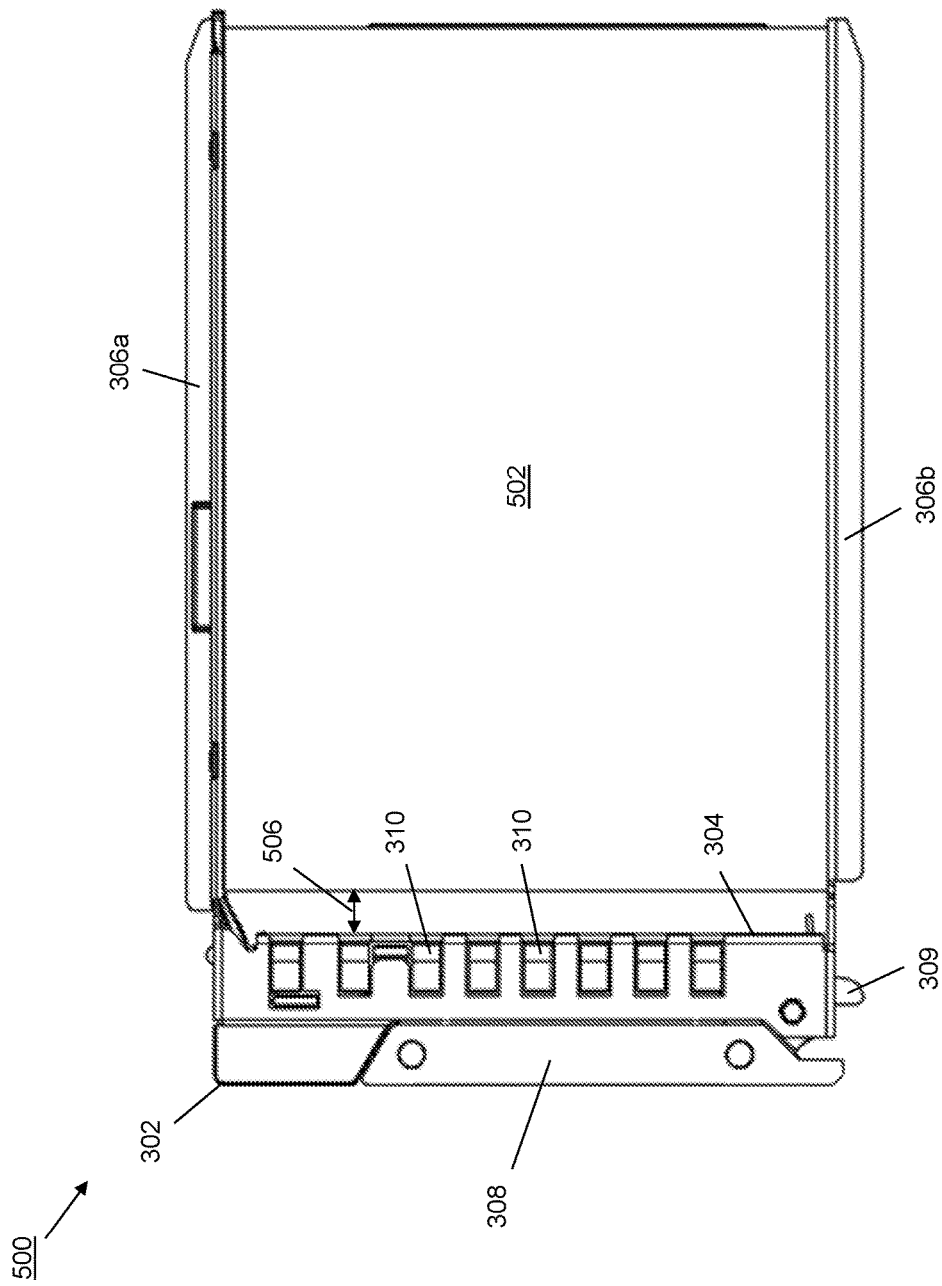
FIG. 5B is a top view illustrating an embodiment of the component mounted to the component carrier in FIG. 5A.
Figure 5C:
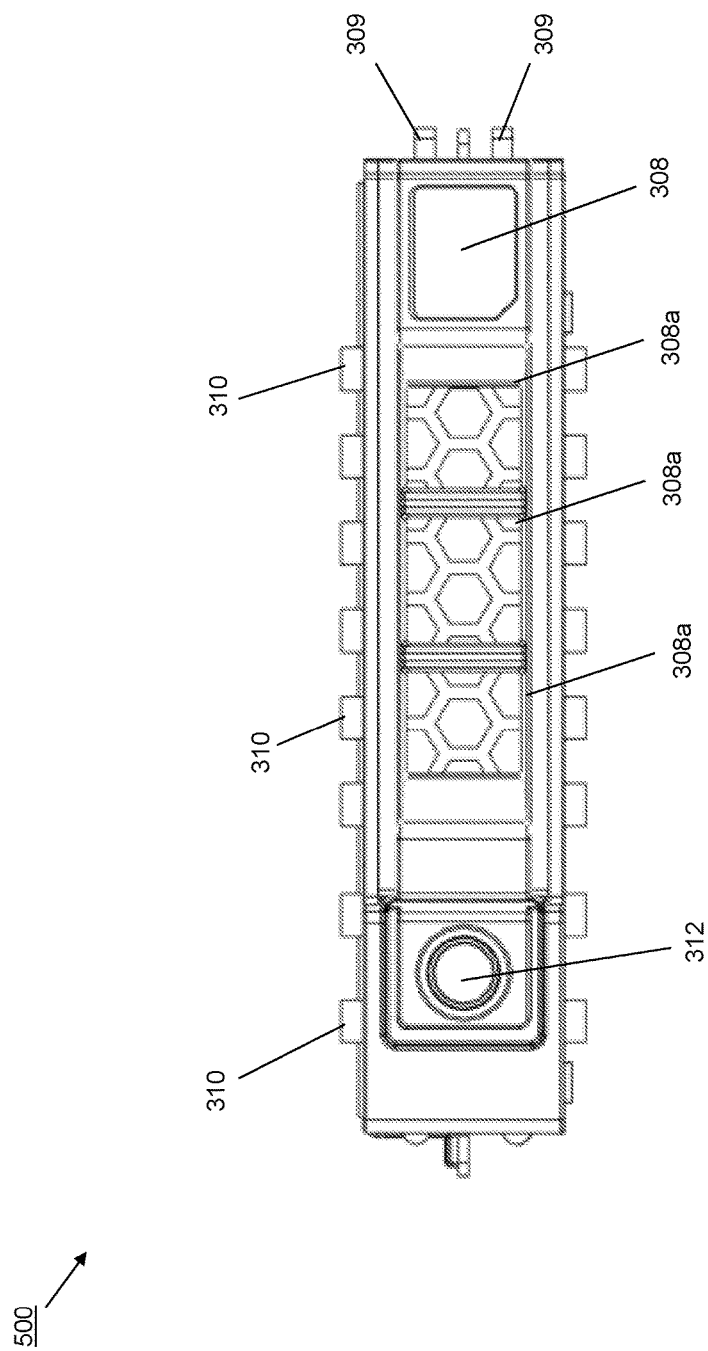
FIG. 5C is a front view illustrating an embodiment of the component mounted to the component carrier in FIG. 5A.
Figure 6A:
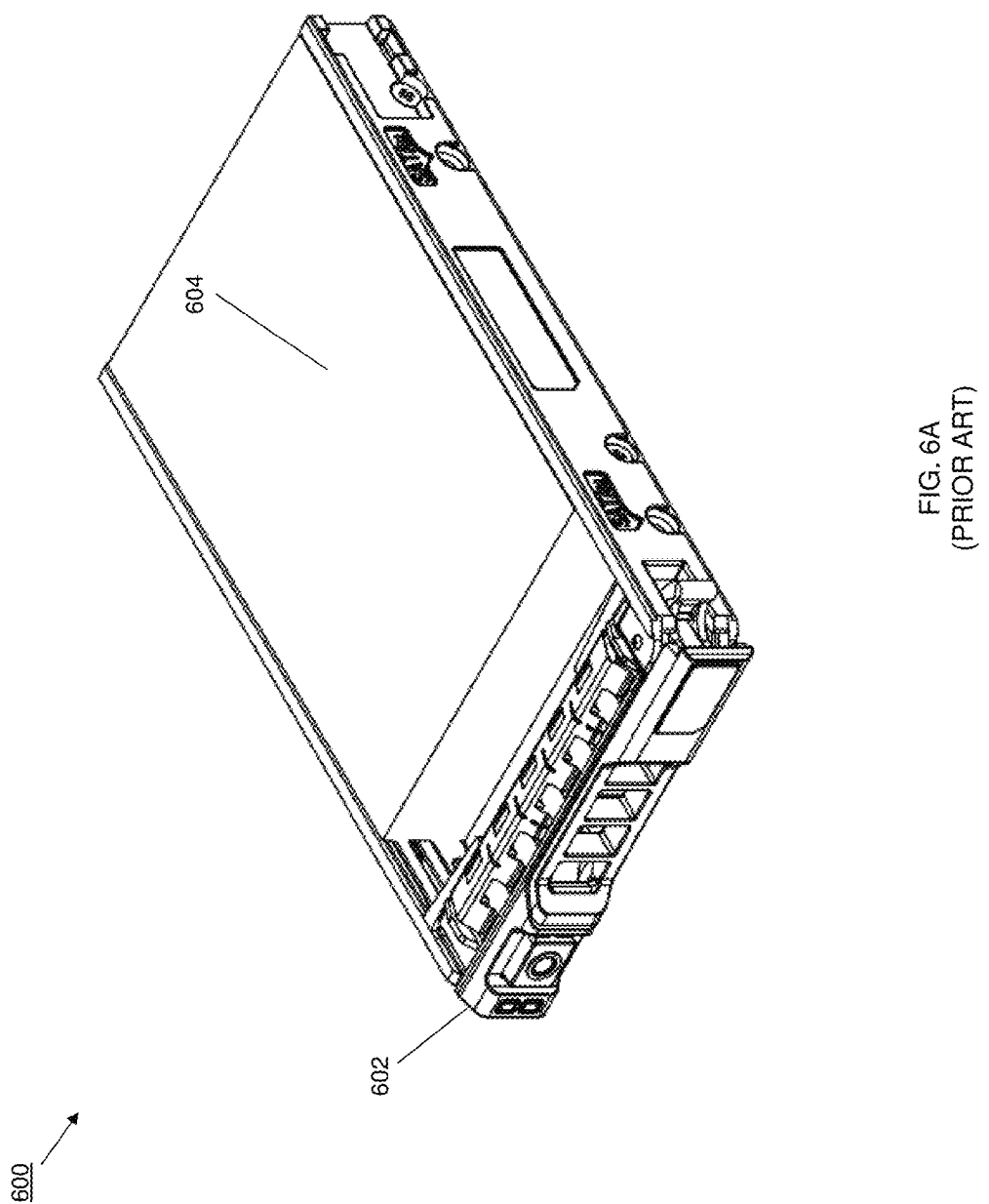
FIG. 6A is a perspective view illustrating an embodiment of a component mounted to a conventional component carrier.
Figure 6B:
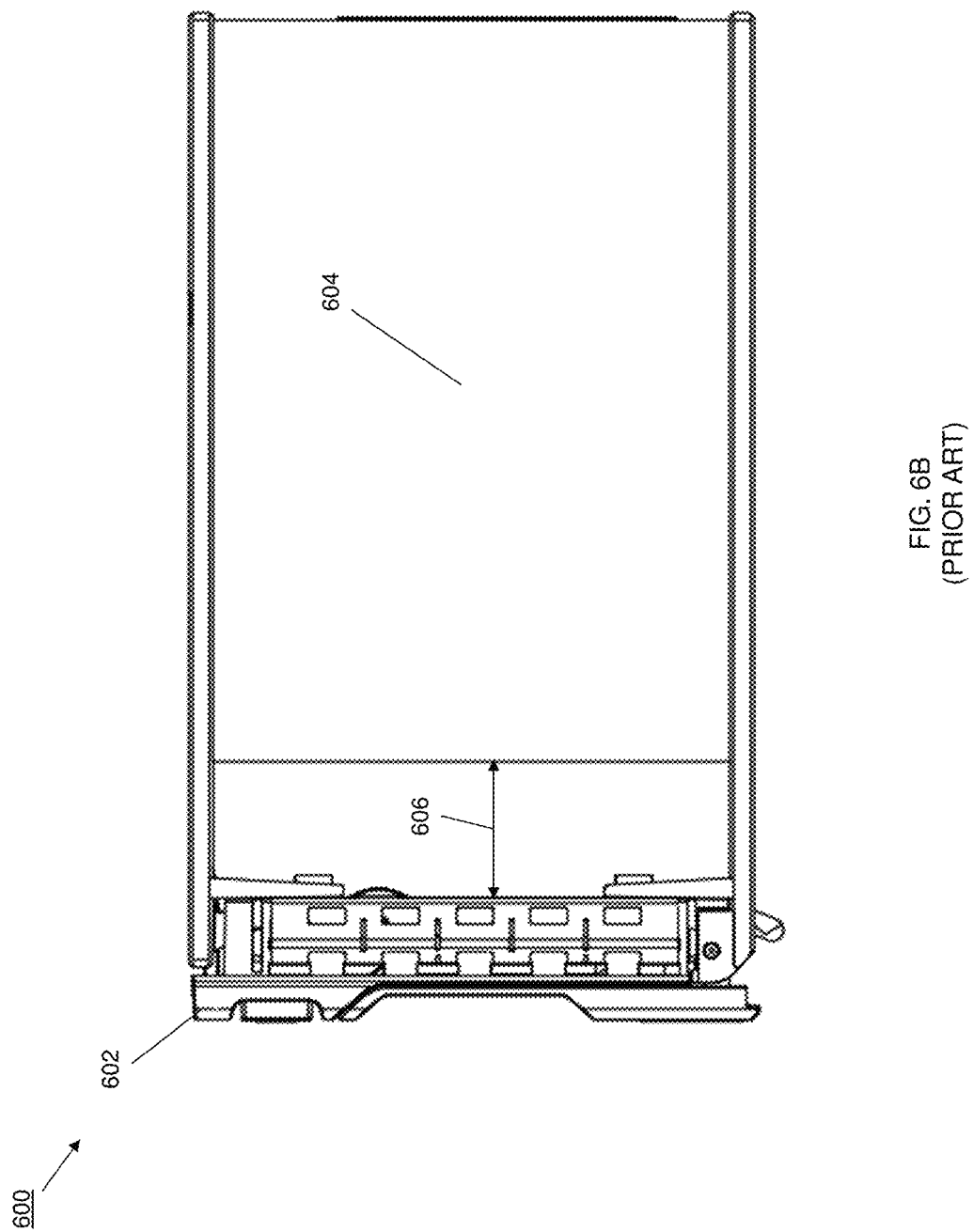
FIG. 6B is a top view illustrating an embodiment of the component mounted to the conventional component carrier in FIG. 6A.
Figure 6C:
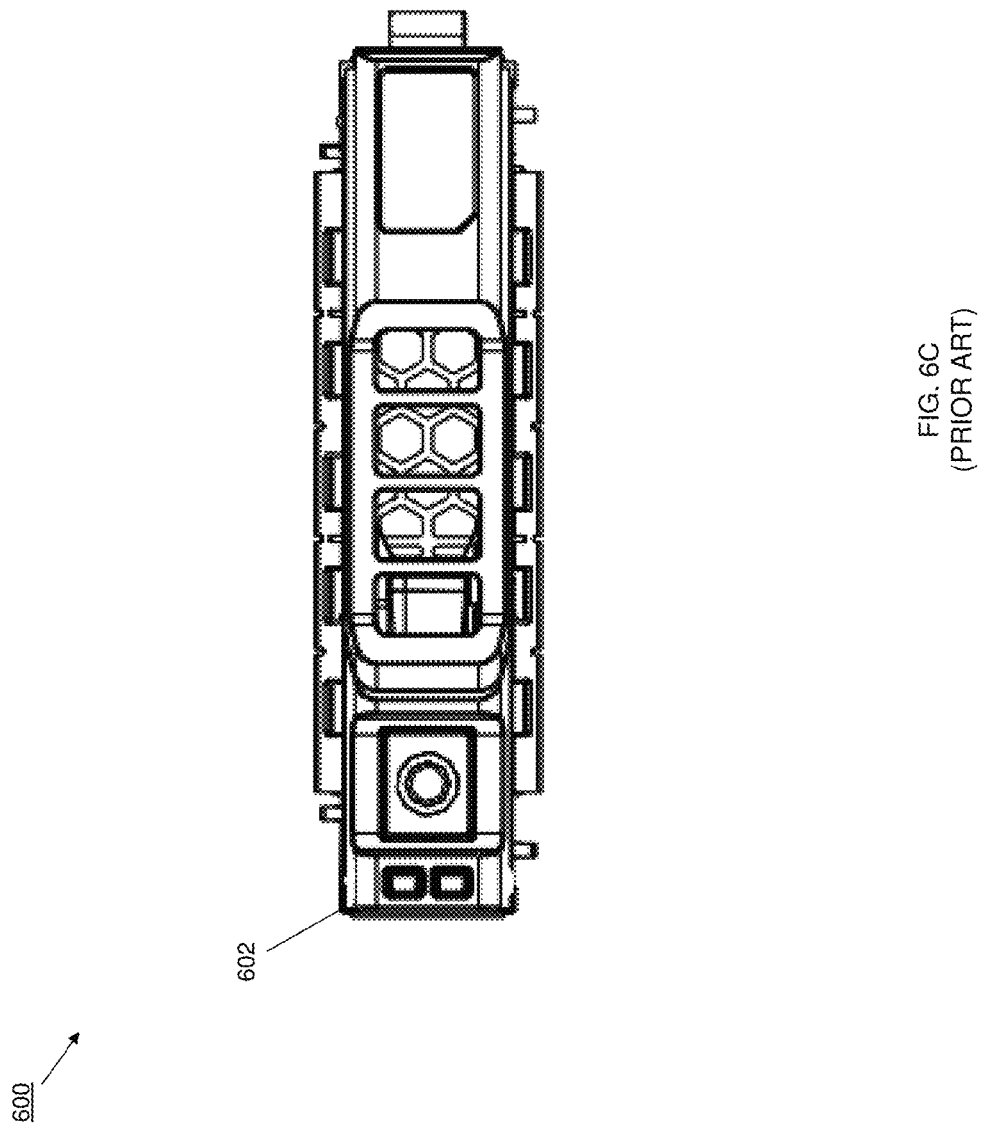
FIG. 6C is a front view illustrating an embodiment of the component mounted to the component carrier in FIG. 6A.

The method 400 begins at block 402 where first components are mounted in first component carriers. Referring now to FIGS. 5A, 5B, and 5C, an embodiment of a component/component carrier 500 is illustrated that may be provided by positioning a component 502 in the component channel 307 and mounting the component 502 to the component carrier 300 by, for example, providing couplers (e.g., the screws 504 in the carrier side walls 306b illustrated in FIG. 5A) that engage the component carrier 300 and the component 502. With the component 502 mounted to the component carrier 300, a spacing 506 is provided between the component 502 and the carrier front wall 304 that has been optimized to both minimize the volume taken up in the component chassis 200 by the component/component carrier 500, while also minimizing impedance to airflow that enters the component channel 307 through the carrier front wall 304. For example, FIGS. 6A, 6B, and 6C illustrated a prior art component/component carrier 600 that includes a conventional component carrier 602 mounted to a conventional component 604. As can be seen in FIG. 6B, the mounting of the conventional component 604 to the conventional component carrier 602 provides a spacing 606 between the component 604 and a front wall of the component carrier 602. It has been found that the reduction of the spacing 606 to the spacing 506 minimizes the volume taken up by the component/component carrier 500 in the component chassis 200 while also minimizing the impedance to airflow that enters the component chassis 200 through the chassis entrance 206 (i.e., further reductions below a spacing 506 were found to increase airflow impedance at the chassis entrance 206), thus maximizing the amount of air that may enter the component chassis 200 and flow through the chassis enclosure 204 to cool the components 502 and 214a-e.

In addition to the optimized spacing 506, benefits of the component/component carrier 500 over the conventional component/component carrier 600 may be appreciated by a comparison of FIGS. 5A, 5B, and 5C with FIGS. 6A, 6B, and 6C. For example, one of skill in the art in possession of the present disclosure will recognize that the component carrier 300 provides a smaller cross section than that of the component carrier 602, and larger component carrier airflow apertures 308a than those of the component carrier 602 that allow increased airflow to the component 502 while also directing airflow not utilized to cool the component 502 past the carrier side walls 306a and 306b. Furthermore, as is illustrated below, features on the component carrier 300 provide for interlocking between the component carriers 300 and the component chassis 200 to provide directed airflow channels discussed below that are combined with chassis venting members to direct the airflow as discussed below. While a few benefits of the component/component carrier 500 have been described, one of skill in the art will recognize that other benefits may be realized by the component/component carrier 500 and component chassis 200 combination while remaining within the scope of the present disclosure.

Figure 7:
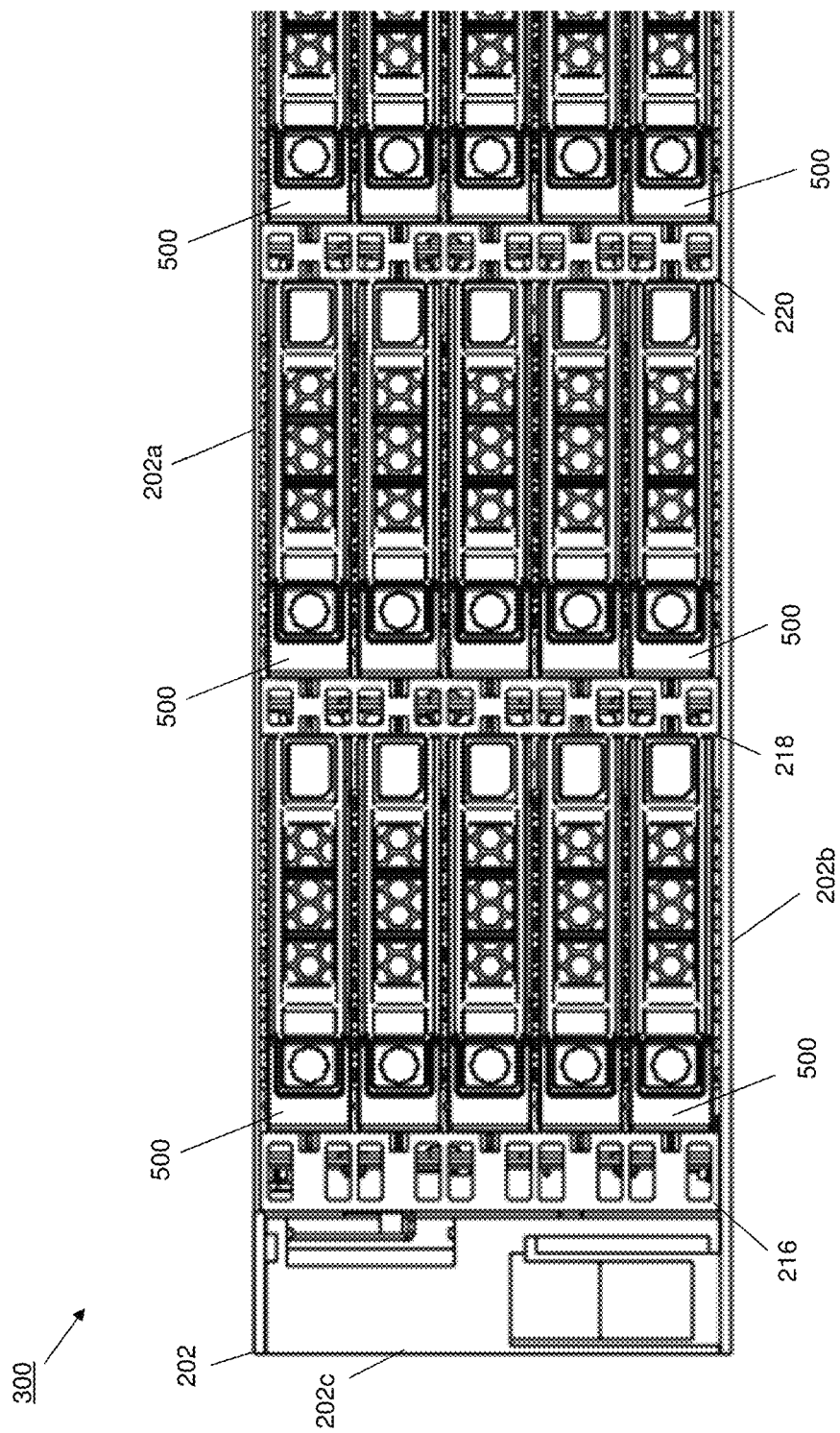
FIG. 7 is a front view illustrating an embodiment of a plurality of the components/component carriers of FIGS. 5A-5C coupled to the component chassis of FIGS. 2A and 2B.

The method 400 then proceeds to block 404 and 406 where component/component carriers are positioned in component slots defined by the component chassis such that the components are connected to component connectors on the backplane in the component chassis. With reference to FIGS. 2A, 2B, 2C, and 7, a respective component/component carrier 500 may be positioned in each of the component slots 210 defined by the component chassis 200 by placing the component/component carrier 500 adjacent the component slot 210 such that the rear of the component 502 (i.e., a surface of the component 502 that is opposite the component 502 from the carrier front wall 304) is adjacent the component slot 210, and then moving the component/component carrier 500 into the component slot 210 (e.g., via engagement of guide features on the carrier side walls 306a and 306b and the guide members 208 on the component chassis 200) until a connector on the component 502 engages the respective connector 212a on the backplane 212 that is adjacent that component slot 210. As can be seen in FIG. 7, with each of the component/component carriers 500 positioned in the component slots 210 in the component chassis 200, the component/component carriers 500 may interlock with each other and the chassis venting members 216-226 such that airflow channels between the component/component carriers 500, as well as between the chassis venting members 216-226 and the component/component carriers 500, are minimized or blocked such that the component carrier airflow apertures 308a defined by the component carriers 300 and the chassis venting member airflow apertures 216a-226a defined by the chassis venting members 216-226 provide the primary means for airflow entering the chassis entrance 206 to reach the chassis enclosure 204.

The method 400 then proceeds to block 408 where airflow that enters the component chassis is directed using chassis venting member airflow apertures. In an embodiment, airflow may be produced through the component chassis 200 by, for example, activating the fan systems 214f to push air in the chassis enclosure 204 out of the back wall 202e of the component chassis 200 and cause air to be drawn through the chassis entrance 206 to produce an airflow that enters the chassis enclosure 204 through the chassis entrance 206. As discussed above, the positioning of the component/component carriers 500 in the component chassis 200 results in the airflow entering the chassis entrance 206 being directed either through the component carrier airflow apertures 308a to cool the component 502, or through the chassis venting member airflow apertures 216a-226a to the backplane 212, and through the backplane airflow apertures 212b to cool one or more of the components 214a-214e opposite the backplane 212 from the chassis entrance 206. In some embodiments, the chassis venting member airflow apertures 216a-226a may be tuned, dimensioned, or otherwise configured to direct that airflow towards particular ones of the components 214a-214e. For example, the processing system 214a may produce more heat than the component 502 and/or the other components 214b-214e, and the chassis venting member airflow apertures 216a and 218a may be configured to direct airflow entering the chassis entrance 206 adjacent the chassis venting members 216 and 218 toward the processing system 214a in order to cool the processing system 214a. Similarly, others of the chassis venting member 220-226 may be configured to direct airflow towards specific components that need cooling as well. As such, the chassis venting members 216-226 may be statically configured for the specific components in the component chassis 200 to ensure cooling of those components using the airflow directed along the carrier side walls 306a and 306b of the component carriers 300.

In some embodiments, the controller 214c may be coupled to the chassis venting members 216-226 in order to dynamically adjust the dimensions or configuration of the chassis venting member airflow apertures 216a-226a as the cooling needs of the components 502 and/or the components 214a-214e change. For example, the processing system 214a may require a first cooling level during normal operations, and then may require a second cooling level that is higher than the first cooling level during the performance of some workloads (e.g., processing intensive workloads). In response to determining that the processing system 214a requires the second cooling level (e.g., in response to detecting the running of a particular workload), the controller 214c may send instructions to adjust the configuration of the chassis venting member airflow apertures 216a and 218a to direct increased airflow entering the chassis entrance 206 adjacent the chassis venting members 216 and 218 toward the processing system 214a in order to provide additional cooling of the processing system 214a. In some embodiments, in addition to controlling the configuration of the chassis venting members 216-226, the controller 214c may control the configuration of the component carrier airflow apertures 308a on the component carriers 300, the operation of the fan systems 214f, and/or other subsystems in the component chassis 200 in order to optimize the airflow through the component chassis 200 to ensure proper and sufficient cooling of the components in the component chassis 200.

Referring now to FIG. 8, an alternative embodiment of component/component carriers 800 located in the component chassis 200 in a vertical orientation is illustrated. As discussed above, the vertical orientation of the component/component carriers 500 may be enabled by the backplane 228 discussed above with reference to FIG. 2D. As can be seen, with the component/component carriers 500 positioned in the component chassis 200, chassis venting members 802 that are similar to the chassis venting members 216-226 discussed above are located between the component/component carriers 500 and may direct airflow past the component/component carriers 500 similarly as discussed above in a static or dynamic manner in order to cool components in the component chassis 200 as needed.

Thus, systems and methods have been described that provide for enhanced cooling in a component chassis by configuring component carriers and chassis venting members for the components in the system in order to ensure airflow entering the component chassis is directed to the components that need it to ensure sufficient cooling of components near the chassis entrance while directing any airflow that is not needed by those components through the component chassis to backplane airflow apertures that provide airflow channels to components positioned behind a backplane. As such, the component chassis may be provided with standard fan systems that do not have to be run a relatively high fan speeds in order to overcome the impedance produced by the components at the chassis entrance, which reduces noise and vibration while ensuring sufficient cooling of the system. As such, a denser component chassis may be provided without the need for more expensive, higher power fan systems that produce more noise and vibration than is desirable, thus provided improved computing systems at lower costs than is available with conventional component carriers and component chassis. For example, experimental embodiments utilizing the teachings of the present disclosure have found 30-90% increases in airflow through the component chassis.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. An enhanced airflow chassis system, comprising:
    a component chassis defining a chassis enclosure that includes a chassis entrance and a plurality of component slots, wherein the component chassis includes a rear wall that is located opposite the component chassis from the chassis entrance;
    a respective first component carrier mounted to a respective first component and positioned in each of the plurality of component slots, wherein each respective first component carrier defines a plurality of first component carrier airflow apertures;
    a backplane that is located in the chassis enclosure opposite the plurality of component slots from the chassis entrance, wherein the backplane defines a plurality of backplane airflow apertures and includes a respective component connector located adjacent each of the plurality of component slots that is connected to the respective first component mounted to the respective first component carrier positioned in a respective component slot of the plurality of component slots;

a chassis venting member that is positioned between at least two of the plurality of component slots, wherein the chassis venting member defines a plurality of chassis venting member airflow apertures; and a fan system positioned in the chassis enclosure between the backplane and the rear wall, wherein the fan system is configured to produce an airflow that causes air to be drawn through the chassis entrance, into the component enclosure, and moved out past the rear wall in a first direction, wherein the respective first component carriers are interlocked with each other and the chassis venting member such that:

the plurality of first component carrier airflow apertures on each respective first component carrier are configured to direct a first portion of the airflow that enters the chassis entrance in the first direction such that the first portion of the airflow moves over the respective first component mounted to that respective first component carrier in the first direction and through a subset of the plurality of backplane airflow apertures in the first direction; and the chassis venting member airflow apertures are configured to direct a second portion of the airflow entering the chassis entrance in the first direction such that the second portion of the airflow moves through the chassis enclosure in the first direction and through at least one of the subset of the plurality of backplane airflow apertures in the first direction without moving over any of the respective first components.

2. The system of claim 1, wherein the chassis venting member is positioned between a first group of the plurality of component slots and a second group of the plurality of component slots.

3. The system of claim 1, wherein the chassis venting member is positioned between a single first component slot of the plurality of component slots and a single second component slot of the plurality of component slots.

4. The system of claim 1, further comprising:

a plurality of second components located in the chassis enclosure opposite the backplane from the plurality of component slots, wherein the plurality of chassis venting member airflow apertures are configured to direct the first portion of the airflow and the second portion of the airflow that enters the chassis entrance through the at least one of the subset of the plurality of backplane airflow apertures to a subset of the plurality of second components that generate more heat than the remaining second components.

5. The system of claim 1, wherein mounting of each respective component to each respective component carrier is configured such that a spacing between each respective component and each respective component carrier produces a minimum impedance to the airflow received through the chassis entrance.

6. The system of claim 1, wherein the first direction is perpendicular to a plane provided by the chassis entrance.

7. The system of claim 1, further comprising:

a controller that is coupled to the chassis venting member and that is configured to adjust the plurality of chassis venting member airflow apertures to direct the airflow that enters the chassis entrance.

8. An Information Handling System (IHS), comprising:

a server chassis defining a storage enclosure that includes an entrance and a plurality of storage drive slots, wherein the server chassis includes a rear wall that is located opposite the server chassis from the entrance;

a respective storage drive carrier mounted to a respective storage drive and positioned in each of the plurality of storage drive slots, wherein each respective storage drive carrier defines a plurality of storage drive carrier apertures;

a backplane that is located in the storage enclosure opposite the plurality of storage drive slots from the entrance of the server chassis, wherein the backplane defines a plurality of backplane airflow apertures and includes a respective storage drive connector located adjacent each of the plurality of storage drive slots that is connected to the respective storage drive mounted to the respective storage drive carrier positioned in a respective storage drive slot of the plurality of storage drive slots;

a processing system coupled to the backplaned;

a server chassis venting member that is positioned between at least two of the plurality of storage drive slots, wherein the server chassis venting member defines a plurality of server chassis venting member airflow apertures; and a fan system positioned in the storage enclosure between the backplane and the rear wall, wherein the fan system is configured to produce an airflow that causes air to be drawn through the entrance, into the storage enclosure, and moved out past the rear wall in a first direction, wherein the respective storage drive carriers are interlocked with each other and the server chassis venting member such that:

the storage drive carrier apertures on each respective storage drive carrier are configured to direct a first portion of airflow that enters the entrance in the first direction such that the first portion of the airflow moves over the respective storage drive mounted to that respective storage drive carrier in the first direction and through a subset of the plurality of backplane airflow apertures in the first direction; and the server chassis venting member airflow apertures are configured to direct a second portion of the airflow entering the entrance in the first direction such that the second portion of the airflow moves through the storage enclosure in the first direction and through at least one of the subset of the plurality of backplane airflow apertures in the first direction without moving over any of the respective storage drives.

9. The IHS of claim 8, wherein the server chassis venting member is positioned between a first group of the plurality of storage drive slots and a second group of the plurality of storage drive slots.

10. The IHS of claim 8, wherein the server chassis venting member is positioned between a single first drive slot of the plurality of storage drive slots and a single second storage drive slot of the plurality of storage drive slots.

11. The IHS of claim 8, wherein the processing system is located in the server chassis enclosure opposite the backplane from the plurality of storage drive slots.

12. The IHS of claim 8, wherein mounting of each respective storage drive to each respective storage drive carrier is configured such that a spacing between each respective storage drive and each respective storage drive carrier produces a minimum impedance to the airflow received through the entrance.

13. The IHS of claim 8, wherein the first direction is perpendicular to a plane provided by the chassis entrance.

14. The IHS of claim 8, further comprising:

a controller that is coupled to the server chassis venting member and that is configured to adjust the plurality of server chassis venting member airflow apertures to direct the airflow that enters the chassis entrance to the processing system.

15. A method for providing airflow in a chassis, comprising: mounting a respective first component in each of a plurality of respective first component carriers;
positioning each respective first component carrier that was mounted to the respective first component in one of a plurality of component slots that are included in a chassis enclosure that is defined by a component chassis that includes a chassis venting member positioned between at least two of the plurality of components slots, wherein each respective first component carrier defines a plurality of first component carrier airflow apertures, and wherein the chassis venting member defines a plurality of chassis venting member airflow apertures;
connecting each respective first component to a respective component connector that is included on a backplane located in the chassis enclosure opposite the plurality of component slots from a chassis entrance, wherein the backplane defines a plurality of backplane airflow apertures, and
generating, using a fan system positioned in the chassis enclosure between the backplane and a rear wall, an airflow that causes air to be drawn through the chassis entrance, into the component enclosure, and moved out past the rear wall in a first direction directing the airflow that enters the chassis entrance through the chassis enclosure,
wherein the respective first component carriers are configured to interlock with each other and the chassis venting member when the respective first components in each of the plurality of respective first component carriers are connected to the respective first component connectors; such that:
the plurality of first component carrier airflow apertures on each respective first component carrier direct a first portion of the airflow that enters the chassis entrance in the first direction such that the first portion of the airflow moves over the respective first component mounted to that respective first component carrier in the first direction and through a subset of the plurality of backplane airflow apertures in the first direction; and
the chassis venting member airflow apertures direct a second portion of the airflow entering the chassis entrance in the first direction such that the second portion of the airflow moves through the chassis enclosure in the first direction and through at least of one of the subset of the plurality of backplane airflow apertures without moving over any of the respective first components in the first direction.

16. The method of claim 15, wherein the chassis venting member is positioned between a first group of the plurality of component slots and a second group of the plurality of component slots.

17. The method of claim 15, wherein the chassis venting member is positioned between a single first component slot of the plurality of component slots and a single second component slot of the plurality of component slots.

18. The method of claim 15, wherein a plurality of second components are located in the chassis enclosure opposite the backplane from the plurality of component slots, and wherein the plurality of chassis venting member airflow apertures direct the first portion of the airflow and the second portion of the airflow that enters the chassis entrance through the at least one of the subset of the plurality of backplane airflow apertures to a subset of the plurality of second components that generate more heat than the remaining second components.

19. The method of claim 15, wherein mounting of each respective component to each respective component carrier is configured such that a spacing between each respective component and each respective component carrier produces a minimum impedance to the airflow received through the chassis entrance.

20. The method of claim 15, wherein the first direction is perpendicular to a plane provided by the chassis entrance.

* * * * *

UNITED STATES PATENT AND TRADEMARK OFFICE
CERTIFICATE OF CORRECTION

PATENT NO.         : 10,010,015 B2
APPLICATION NO.    : 14/981232
DATED              : June 26, 2018
INVENTOR(S)        : Chris Everett Peterson et al.

Page 1 of 1

It is certified that error appears in the above-identified patent and that said Letters Patent is hereby corrected as shown below:

In the Claims

Claim 8, Column 12, Line 16: replace "backplaned" with --backplane--

Signed and Sealed this
Fifth Day of March, 2019

Andrei Iancu
*Director of the United States Patent and Trademark Office*